(12) United States Patent
Wong (10) Patent No.: US 6,611,428 B1
(45) Date of Patent: Aug. 26, 2003

(54) CABINET FOR COOLING ELECTRONIC MODULES

(75) Inventor: Henry Wong, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/216,955

(22) Filed: Aug. 12, 2002

(51) Int. Cl.[7] ................................................ H05K 7/20
(52) U.S. Cl. ...................... 361/695; 361/690; 361/694; 361/692; 174/16.1; 165/104.33; 165/122; 454/184
(58) Field of Search .......................... 361/688–690, 361/694, 695; 174/15.1, 16.1; 165/80.2, 104.33, 122; 454/184

(56) References Cited

U.S. PATENT DOCUMENTS

| | | | |
|---|---|---|---|
| 3,956,673 A | | 5/1976 | Seid |
| 4,293,891 A | | 10/1981 | Matsui et al. |
| 4,612,979 A | | 9/1986 | Heitzig |
| 4,774,631 A | | 9/1988 | Okuyama et al. |
| 5,493,474 A | * | 2/1996 | Schkrohowsky et al. ... 361/695 |
| 5,544,012 A | * | 8/1996 | Koike .......................... 361/695 |
| 5,886,639 A | * | 3/1999 | Behl et al. .................. 340/635 |
| 5,982,618 A | | 11/1999 | Roos |
| 6,088,225 A | | 7/2000 | Parry et al. |
| 6,123,266 A | * | 9/2000 | Bainbridge et al. ........ 236/49.3 |
| 6,459,579 B1 | * | 10/2002 | Farmer et al. ............... 361/695 |
| 6,496,366 B1 | * | 12/2002 | Coglitore et al. ........... 361/687 |
| 6,506,111 B2 | * | 1/2003 | Sharp et al. ................. 454/184 |

\* cited by examiner

Primary Examiner—Boris Chérvinsky
(74) Attorney, Agent, or Firm—Kevin D. Wills (57) ABSTRACT

A cabinet (100) for cooling electronic modules includes a first side surface (102), a second side surface (104), a front surface (106) and a rear surface (707). A plurality of chassis (108) is encompassed by the plurality of outer surfaces, wherein the plurality of chassis (108) and the first side surface (102) define a first interspace region (110), and wherein the plurality of chassis (108) and the second side surface (104) define a second interspace region (112). A plurality of electronic modules (114) is coupled to each of the plurality of chassis (108), where the plurality of electronic modules (114) are substantially horizontally disposed within each of the plurality of chassis (108), and wherein at least a portion of the plurality of electronic modules produce more than 150 Watts of thermal energy each. An air moving apparatus (118) draws cooling air (116) external to the cabinet (117) into the first interspace region (110), wherein the cooling air (116) passes over the plurality of electronic modules (114) in a substantially horizontal manner and substantially parallel to the front surface (106) and the rear surface (707), wherein the cooling air (116) subsequently enters the second interspace region (112) and is thereafter exhausted from the cabinet (100).

10 Claims, 7 Drawing Sheets

CABINET FOR COOLING ELECTRONIC MODULES

BACKGROUND OF THE INVENTION

Existing electronic equipment cabinets generally employ forced air convection cooling of electronic modules mounted in chassis within the cabinet. Also, most prior art cabinet and chassis configurations utilize vertical electronic module orientation with cooling air circulating in either a front-to-back or back-to-front pattern over the electronic modules. This configuration has the disadvantage of discharging hot exhaust air to either the front or rear of a cabinet and thereby impinging upon system personnel or cables connected to the cabinet. The hot exhaust air can be uncomfortable for system personnel and can cause degradation of cables over time. As processor speeds increase and electronic-modules generate more thermal energy, prior art configurations and methods of cooling electronic modules and their cabinets will become inadequate. In fact, the additional heat generated by the higher-powered electronic modules can become intolerable to system personnel required to maintain the electronic equipment and systems and can hasten degradation of interconnecting cables.

Accordingly, there is a significant need for an apparatus and method that overcomes the deficiencies of the prior art outlined above.

BRIEF DESCRIPTION OF THE DRAWINGS

Referring to the drawing.

It will be appreciated that for simplicity and clarity of illustration, elements shown in the drawing have not necessarily been drawn to scale. For example, the dimensions of some of the elements are exaggerated relative to each other. Further, where considered appropriate, reference numerals have-been repeated among the Figures to indicate corresponding elements.

DESCRIPTION OF THE PREFERRED EMBODIMENTS

In the following detailed description of exemplary embodiments of the invention, reference is made to the accompanying drawings (where like numbers represent like elements), which illustrate specific exemplary embodiments in which the invention may be practiced. These embodiments are described in sufficient detail to enable those skilled in the art to practice the invention, but other embodiments may be utilized and logical, mechanical, electrical and other changes may be made without departing from the scope of the present invention. The following detailed description is, therefore, not to be taken in a limiting sense, and the scope of the present invention is defined only by the appended claims.

In the following description, numerous specific details are set forth to provide a thorough understanding of the invention. However, it is understood that the invention may be practiced without these specific details. In other instances, well-known circuits, structures and techniques have not been shown in detail in order not to obscure the invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical, electrical, or logical contact. However, "coupled" may mean that two or more elements are not in direct contact with each other, but yet still co-operate or interact with each other.

For clarity of explanation, the embodiments of the present invention are presented, in part, as comprising individual functional blocks. The functions represented by these blocks may be provided through the use of either shared or dedicated hardware, including, but not limited to, hardware capable of executing software. The present invention is not limited to implementation by any particular set of elements, and the description herein is merely representational of one embodiment.

Figure 1:
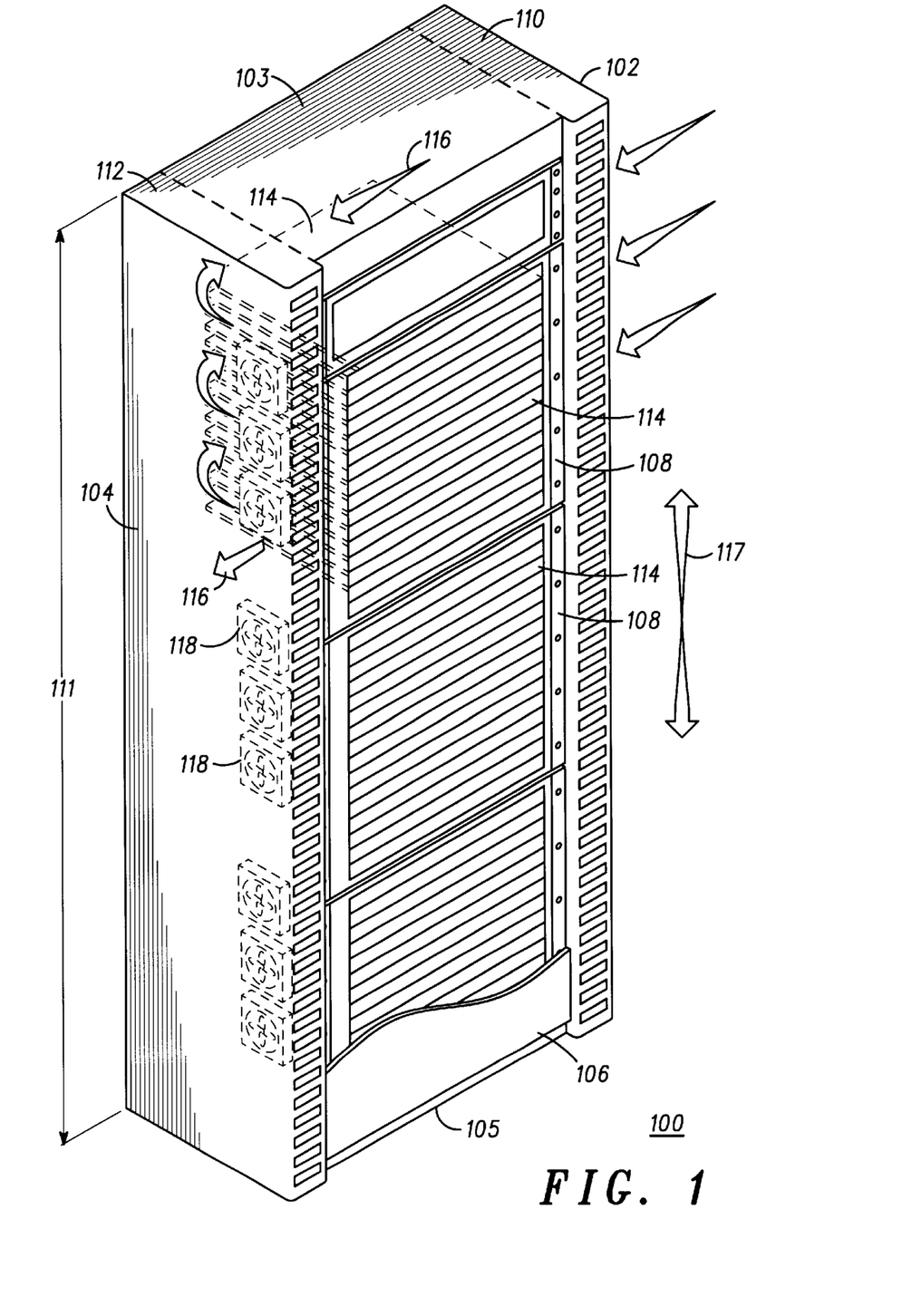
FIG. 1 is a front elevational view of a cabinet in accordance with an embodiment of the invention.

FIG. 1 is a front elevational view of a cabinet 100 in accordance with an embodiment of the invention. As shown in FIG. 1, cabinet 100 is defined by a plurality of outer surfaces including a front surface 106, first side surface 102, second side surface 104, top surface 103 and bottom surface 105, where top surface 103 and bottom surface 105 are both substantially perpendicular to first side surface 102 and second side surface 104. Cabinet 100 includes a plurality of chassis 108 mounted inside of cabinet 100 and encompassed by the plurality of surfaces. A plurality of electronic modules 114 can be coupled to each of the plurality of chassis 108.

Cabinet 100 and plurality of chassis 108 are known in the art and can be used in any application requiring modular computing resources, for example and without limitation, telecommunications, industrial control, system control and data acquisition (SCADA), and the like. An example of cabinet 100 and plurality of chassis 108, including dimensions, and the like, is set forth in the American National Standards Institute/Electronic Industries Association (ANSI/EIA) specification 310, published by EIA Engineering Department, 2001 Pennsylvania Ave. N.W., Washington D.C. 20006. Another example of cabinet 100 and plurality of chassis 108, including dimensions, and the like, is set forth in the European Telecommunications Standard for equipment practice Part 3: Engineering requirements for miscellaneous chassis and cabinets (ETS 300 119-3), as published by European Telecommunication Standards Institute (ETSI), 650 Route des Lucioles, Sophia Antipolis, Valbonne, France. The invention is not limited to cabinets and chassis in the above specifications and can include any cabinet and chassis configuration designed to support electronic modules.

Each of the plurality of electronic modules 114 can include a printed circuit board (PCB) having any number of electronic devices located thereon, for example, and without limitation, processors, memory, storage devices, I/O elements, and the like. In an embodiment of the invention, at least a portion of the plurality of electronic modules 114 in cabinet 100 can be classified as high-powered, meaning they produce more than 150 Watts (W) of thermal energy each when in steady-state operation.

Plurality of electronic modules 114 can encompass or be a part of a larger computer network. Examples of computer networks that use cabinet 100, plurality of chassis 108, electronic modules 114, and the like, are interconnected by the Peripheral Component Interconnect (PCI) bus or VERSA module Eurocard (VMEbus) bus. Electronic modules 114 utilizing the PCI standard, including mechanical dimensions, electrical specifications, and the like are known in the art, and set forth in the PCI Local Bus Specification revision 2.3 or later as promulgated by the PCI Special Interest Group, 5300 N.E. Elam Young Parkway, Hillsboro, Oreg. Electronic modules 114 utilizing the VMEbus standard, including mechanical dimensions, electrical specifications, and the like, are known in the art and set forth in the ANSI/VITA 1-1994 and ANSI/VITA 1.1-1997 standards promulgated by the VMEbus International Trade Association (VITA), P.O. Box 19658, Fountain Hills, Ariz., 85269. The invention is not limited to the use of the above network types and can include electronic modules designed to interface with other types of networks, for example and without limitation, RapidIO™, Serial RapidIO™, PCI Express™, InfiniBand™, Hypertransport™, FibreChannel™, Ethernet™ networks, and the like.

As shown in FIG. 1, first side surface 102 and plurality of chassis 108 define first interspace region 110. In one embodiment, first interspace region 110 extends the height 111 of cabinet 100. In another embodiment, first interspace region 110 extends a portion of the height 111 of cabinet 100. In still another embodiment, first interspace region 110 can be divided into a plurality of regions. The specific size and configuration of first interspace region 110 can be tailored by one skilled in the art to fit a specific application and be within the scope of the invention.

Also, second side surface 104 and plurality of chassis 108 define second interspace region 112. In one embodiment, second interspace region 112 extends the height 111 of cabinet 100. In another embodiment, second interspace region 112 extends a portion of the height 111 of cabinet 100. In still another embodiment, second interspace region 112 can be divided into a plurality of regions. The specific size and configuration of second interspace region 112 can be tailored by one skilled in the art to fit a specific application and be within the scope of the invention.

In an embodiment of the invention, first interspace region 110 and second interspace region 112 operate as air plenums to facilitate cooling of plurality of electronic modules 114 and cabinet 100 using air moving apparatus 118, as described in greater detail below. In an embodiment of the invention, plurality of electronic modules 114 are horizontally disposed within each of the plurality of chassis 108. This has the advantage of increasing the packing density of plurality of electronic modules 114 within cabinet 100. In other words, more of plurality of electronic modules 114 can be disposed inside of cabinet 100 as opposed to a vertical orientation of plurality of electronic modules 114. A further advantage of this configuration is that cooling air 116 can be drawn externally of cabinet 117 and passed over plurality of electronic modules 114 in a substantially horizontal manner and substantially parallel to front surface 106 and rear surface (shown in FIG. 7). This lowers the impedance of cooling air 116 over prior art configurations of vertically disposed modules and front-to-back cooling, and allows more cooling air 116 for a given size and capacity of air moving apparatus 118.

Air moving apparatus 118 can include one or more fans, blowers, and the like, can be configured in any combination of "push" or "pull" patterns. In other words, air moving apparatus can either "push" cooling air 116 over plurality of electronic modules 114, "pull" cooling air 116 over plurality of electronic modules 114, or any combination thereof. As an example of an embodiment of the invention, each of the plurality of chassis 108 can include one or more muffin fans. The number and operating point of air moving apparatus 118 can be chosen to fit a particular application and is well within the abilities of one of ordinary skill in the art. Although air moving apparatus 118 is shown as part of plurality of chassis 108, air moving apparatus can be located anywhere coupled to cabinet 100 and be within the scope of the invention. For example and without limitation, air moving apparatus 118 can coupled to cabinet 100 instead of plurality of chassis 108, and the like.

In an embodiment of the invention, cooling air 116 enters first interspace region 110, which acts as a plenum. Cooling air 116 passes over plurality of electronic modules 114 in a substantially horizontal manner and substantially parallel to front surface 106 and rear surface (shown in FIG. 7). Subsequently, cooling air 116 enters second interspace region 112 and is thereafter exhausted from cabinet 100. In a preferred embodiment of the invention, the configuration shown in FIG. 1 is designed for high-powered applications, where cooling air 116 removes at least 8,000 W of thermal energy from cabinet 100.

Although FIG. 1 depicts first interspace region 110 on the right of cabinet 100 and second interspace region 112 on the left of cabinet 100, this configuration is not limiting of the invention. First interspace region 110 and second interspace region 112 are interchangeable, and first interspace region 110 can be disposed on the left of cabinet 100 and second interspace region 112 can be disposed on the right of cabinet 100, and be within the scope of the invention.

Figure 2:
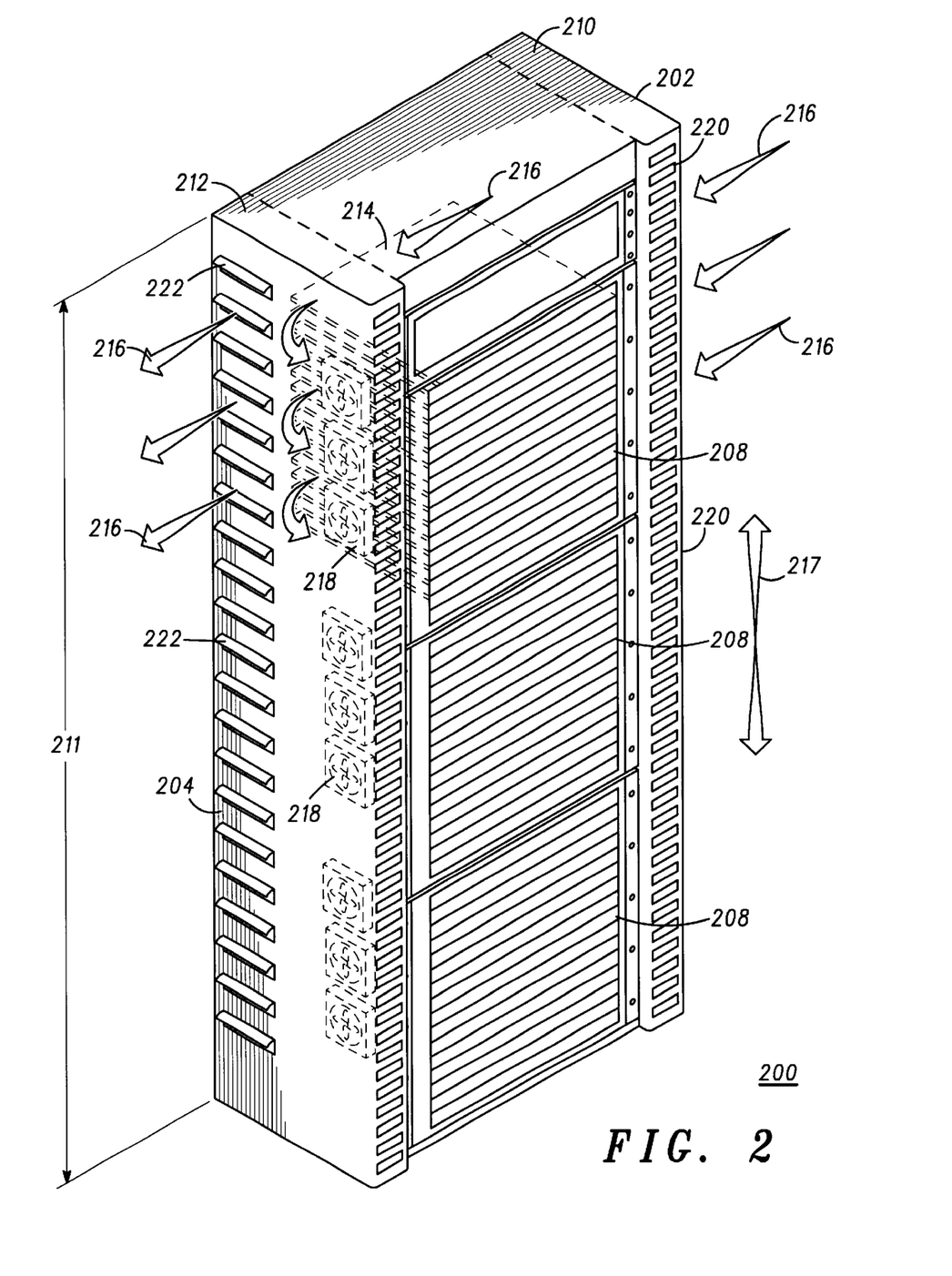
FIG. 2 is a front elevational view of a cabinet in accordance with an embodiment of the invention.

FIG. 2 is a front elevational view of a cabinet 200 in accordance with an embodiment of the invention. As shown in FIG. 2, cooling air 216 enters cabinet 200 via first interspace region 210 and first side surface 202. First side surface 202 and plurality of chassis 208 define first interspace region 210. First side surface 202 defines a plurality of side inlet orifices 220 to allow cooling air 216 to enter first interspace region 210. In the embodiment shown, plurality of side inlet orifices 220 extend the height 211 of cabinet 200. In other embodiment, plurality of side inlet orifices 220 extend a portion of the height 211 of cabinet 200. The number and placement of plurality of side inlet orifices 220 can be tailored by one skilled in the art to fit a specific application and be within the scope of the invention.

Figure 7:
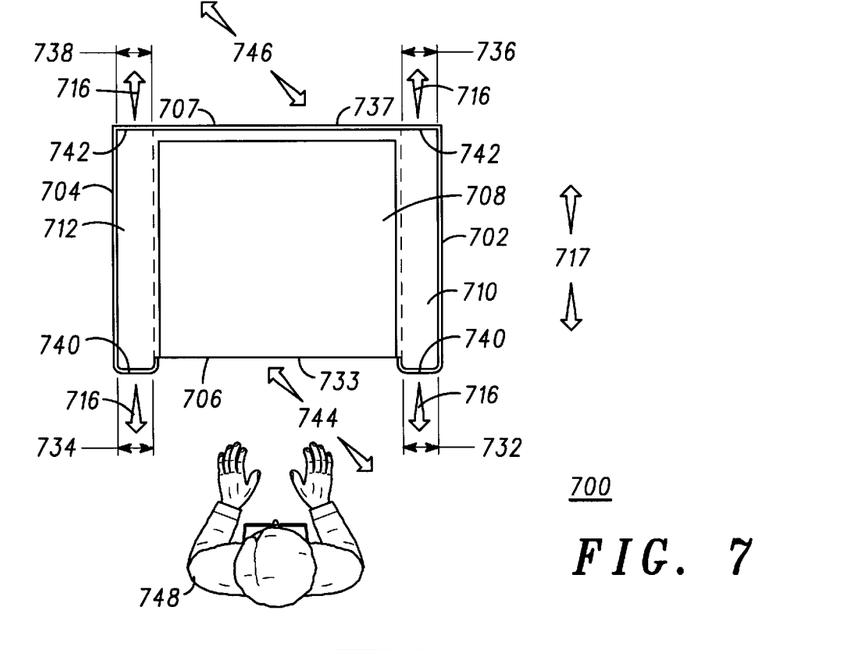
FIG. 7 is a top plan view of a cabinet in accordance with yet another embodiment of the invention.

Cooling air 216 external to cabinet 217 is drawn into first interspace region 210 and passes over plurality of electronic modules 214 in a substantially horizontal manner and substantially parallel to front surface 106 and rear surface (shown in FIG. 7). Cooling air 216 subsequently enters second interspace region 212 defined by second side surface 204 and plurality of chassis 208. Second side surface 204 defines a plurality side exhaust orifices 222 through which cooling air 216 exits cabinet 200. In the embodiment shown, plurality of side exhaust orifices 222 extend the height 211 of cabinet 200. In another embodiment, plurality of side exhaust orifices 222 extend a portion of the height 211 of cabinet 200. The number and placement of plurality of side exhaust orifices 222 can be tailored by one skilled in the art to fit a specific application and be within the scope of the invention.

First interspace region 210 and second interspace region 212 can act as air plenums for the introduction and exhaustion of cooling air 216 respectively, passing through cabinet 200. Cooling air 216 can be drawn into cabinet 200 and first interspace region 210, over plurality of electronic modules 214, into second interspace region 212 and exhausted from cabinet 200 using air moving apparatus 218. In an embodiment of the invention, cooling air 216 removes at least 8,000 W of thermal energy from cabinet 200. Plurality of side inlet orifices 220, plurality of side exhaust orifices 222 and the number and operating point of air moving apparatus 218 can be chosen and sized to fit a particular application and is well within the abilities of one of ordinary skill in the art.

Figure 3:
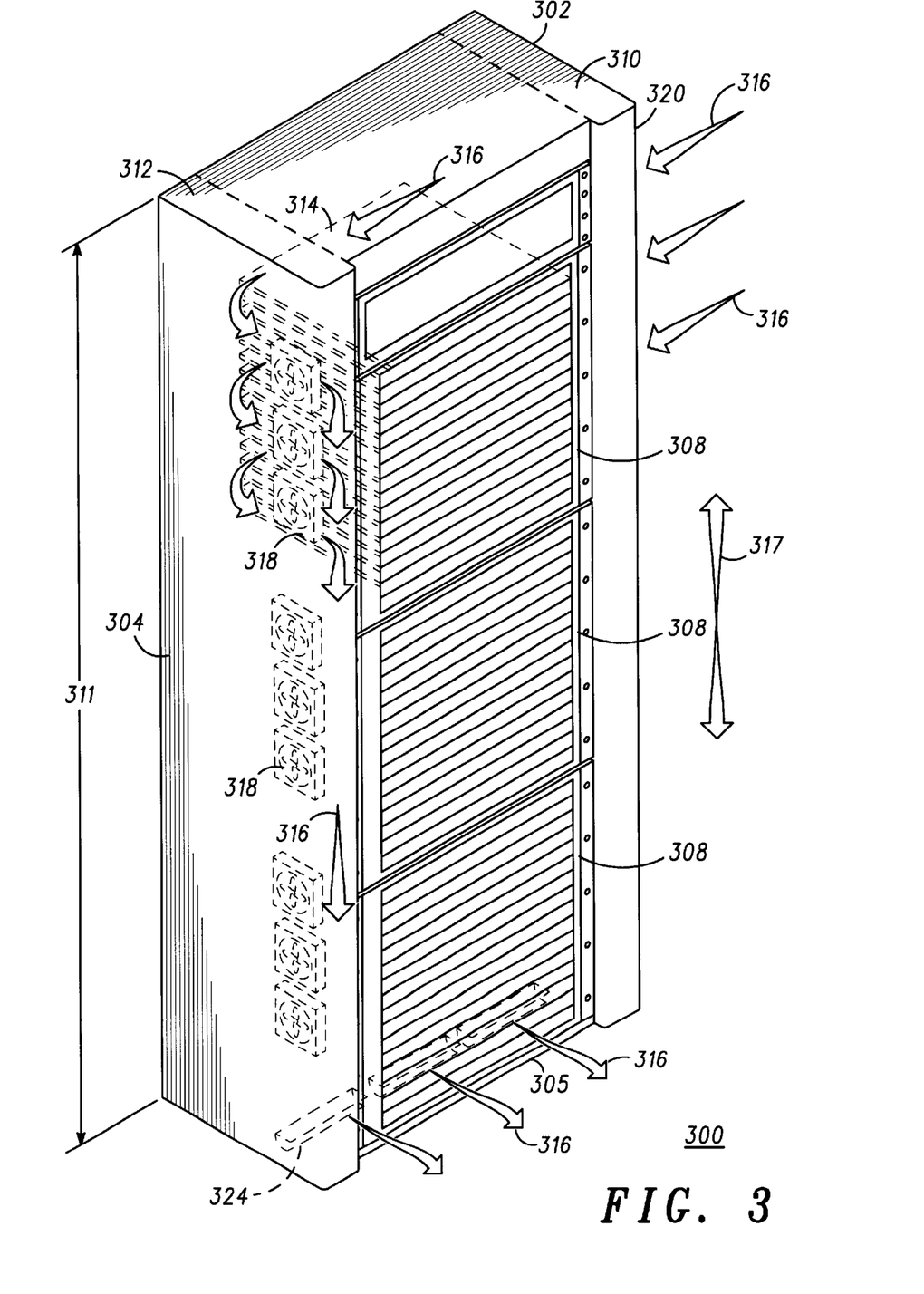
FIG. 3 is a front elevational view of a cabinet in accordance with another embodiment of the invention.

FIG. 3 is a front elevational view of a cabinet 300 in accordance with another embodiment of the invention. As shown in FIG. 3, cooling air 316 enters cabinet 300 via first interspace region 310 and first side surface 302. First side surface 302 and plurality of chassis 308 define first interspace region 310. First side surface 302 defines a plurality of first side inlet orifices 320 to allow cooling air 316 to enter first interspace region 310. In the embodiment shown, plurality of side inlet orifices 320 extend the height 311 of cabinet 300. In other embodiment, plurality of side inlet orifices 320 extend a portion of the height 311 of cabinet 300.

Cooling air 316 external to cabinet 317 is drawn into first interspace region 310 and passes over plurality of electronic modules 314 in a substantially horizontal manner and substantially parallel to front surface 106 and rear surface (shown in FIG. 7). Cooling air 316 subsequently enters second interspace region 312 defined by second side surface 304 and plurality of chassis 308. Bottom surface 305 defines a plurality bottom exhaust orifices 324 through which cooling air 316 exits cabinet 300. Plurality of bottom exhaust orifices 324 can be placed on bottom surface 305 in any location and pattern to facilitate the passing of cooling air 316. First interspace region 310 and second interspace region 312 can act as air plenums for the introduction and exhaustion of cooling air 316 respectively, passing through cabinet 300. Cooling air 316 can be drawn into cabinet 300 and first interspace region 310, over plurality of electronic modules 314, into second interspace region 312 and exhausted from cabinet 300 using air moving apparatus 318. In an embodiment of the invention, cooling air 316 removes at least 8,000 W of thermal energy from cabinet 300. Plurality of side inlet orifices 320, plurality of bottom exhaust orifices 324 and the number and operating point of air moving apparatus 318 can be chosen and sized to fit a particular application and is well within the abilities of one of ordinary skill in the art.

Figure 4:
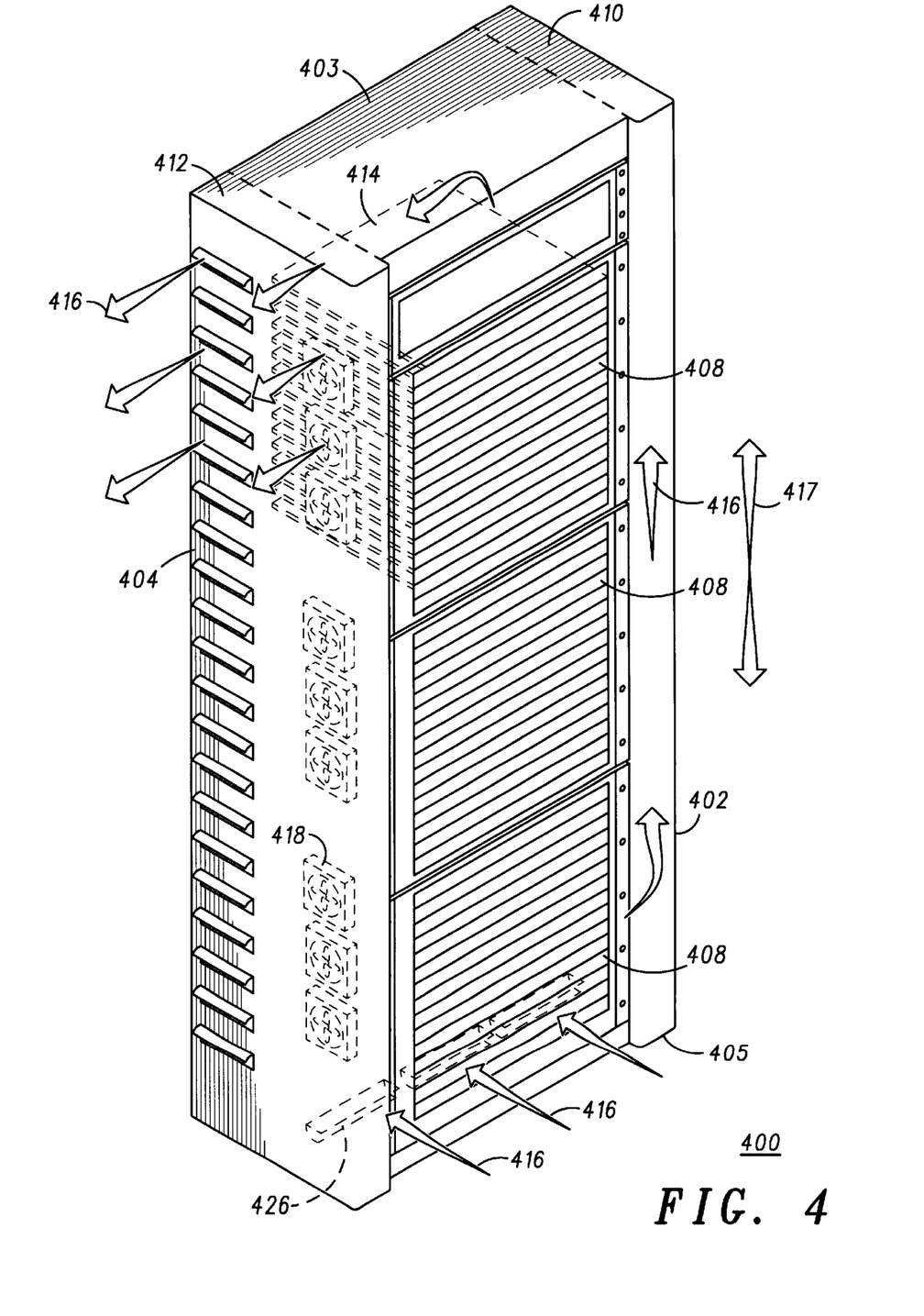
FIG. 4 is a front elevational view of a cabinet in accordance with yet another embodiment of the invention.

FIG. 4 is a front elevational view of a cabinet 400 in accordance with yet another embodiment of the invention. As shown in FIG. 4, bottom surface 405 defines a plurality of bottom inlet orifices 426 through which cooling air 416 enters cabinet 400 via first interspace region 410. Plurality of bottom inlet orifices 426 can be placed on bottom surface 405 in any location and pattern to facilitate the passing of cooling air 416. First side surface 402 and plurality of chassis 408 define first interspace region 410.

Cooling air 416 external to cabinet 417 is drawn into first interspace region 410 via plurality of bottom inlet orifices 426 and passes over plurality of electronic modules 414 in a substantially horizontal manner and substantially parallel to front surface 106 and rear surface (shown in FIG. 7). Cooling air 416 subsequently enters second interspace region 412 defined by second side surface 404 and plurality of chassis 408. Cooling air 416 is subsequently exhausted from cabinet 400, through, for example and without limitation, second side surface 404, top surface 403, and the like. First interspace region 410 and second interspace region 412 can act as air plenums for the introduction and exhaustion of cooling air 416 respectively, passing through cabinet 400. Cooling air 416 can be drawn into cabinet 400 and first interspace region 410, over plurality of electronic modules 414, into second interspace region 412 and exhausted from cabinet 400 using air moving apparatus 418. In an embodiment of the invention, cooling air 416 removes at least 8,000 W of thermal energy from cabinet 400. Plurality of bottom inlet orifices 426, and the number and operating point of air moving apparatus 418 can be chosen and sized to fit a particular application and is well within the abilities of one of ordinary skill in the art.

Figure 5:
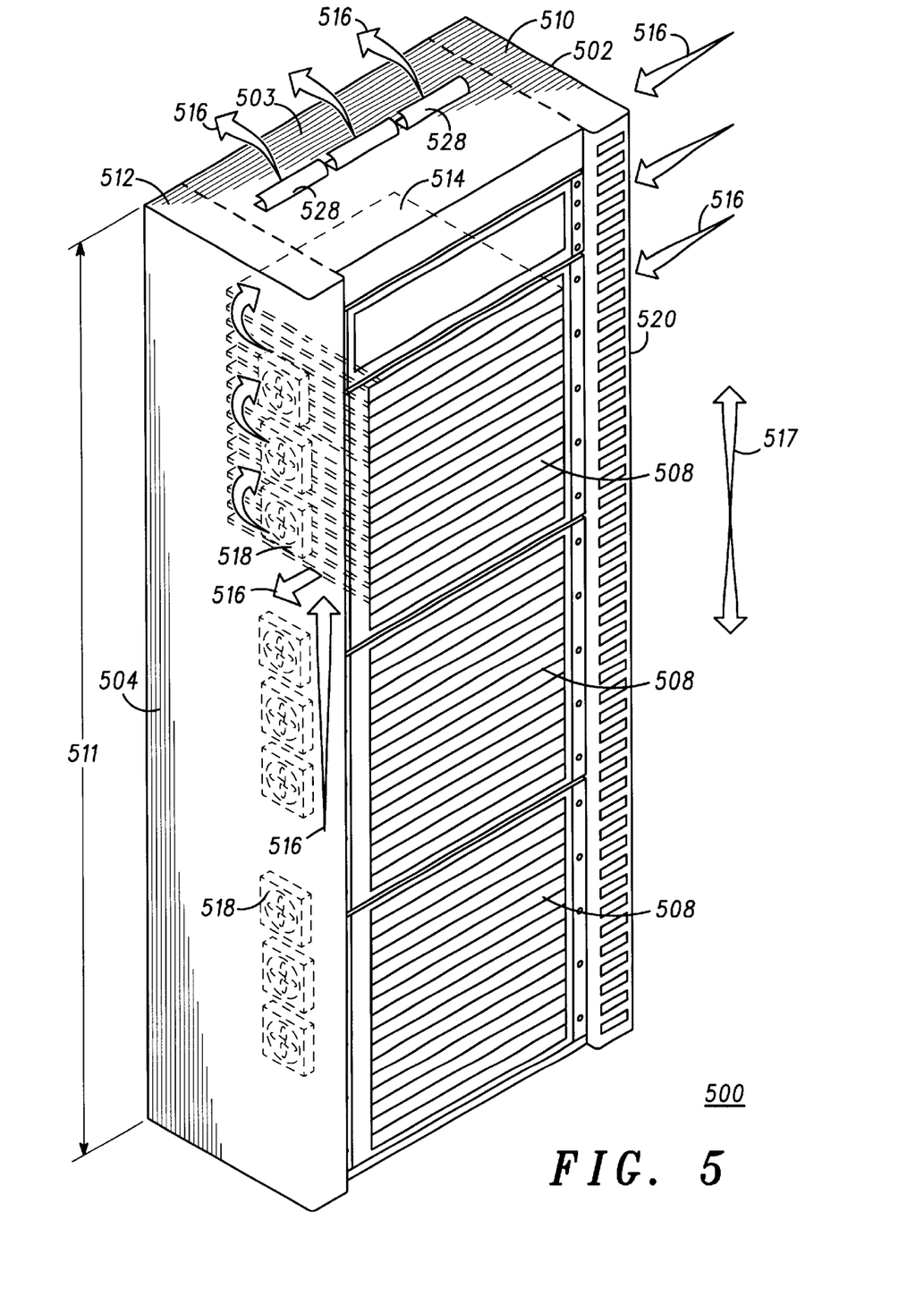
FIG. 5 is a front elevational view of a cabinet in accordance with still another embodiment of the invention.

FIG. 5 is a front elevational view of a cabinet 500 in accordance with still another embodiment of the invention. As shown in FIG. 5, cooling air 516 enters cabinet 500 via first interspace region 510 and first side surface 502. First side surface 502 and plurality of chassis 508 define first interspace region 510. First side surface 502 defines a plurality of first side inlet orifices 520 to allow cooling air 516 to enter first interspace region 510. In the embodiment shown, plurality of side inlet orifices 520 extend the height 511 of cabinet 500. In other embodiment, plurality of side inlet orifices 520 extend a portion of the height 511 of cabinet 500. The number and placement of plurality of side inlet orifices 520 can be tailored by one skilled in the art to fit a specific application and be within the scope of the invention.

Cooling air 516 external to cabinet 517 is drawn into first interspace region 510 and passes over plurality of electronic modules 514 in a substantially horizontal manner and substantially parallel to front surface 106 and rear surface (shown in FIG. 7). Cooling air 516 subsequently enters second interspace region 512 defined by second side surface 504 and plurality of chassis 508. Top surface 503 defines a plurality top exhaust orifices 528 through which cooling air 516 exits cabinet 500. Plurality of top exhaust orifices 528 can be placed on top surface 503 in any location and pattern to facilitate the passing of cooling air 516. First interspace region 510 and second interspace region 512 can act as air plenums for, the introduction and exhaustion of cooling air 516 respectively, passing through cabinet 500. Cooling air 516 can be drawn into cabinet 500 and first interspace region 510, over plurality of electronic modules 514, into second interspace region 512 and exhausted from cabinet 500 using air moving apparatus 518. In an embodiment of the invention, cooling air 516 removes at least 8,000 W of thermal energy from cabinet 500. Plurality of side inlet orifices 520, plurality of top exhaust orifices 528 and the number and operating point of air moving apparatus 518 can be chosen and sized to fit a particular application and is well within the abilities of one of ordinary skill in the art.

Figure 6:
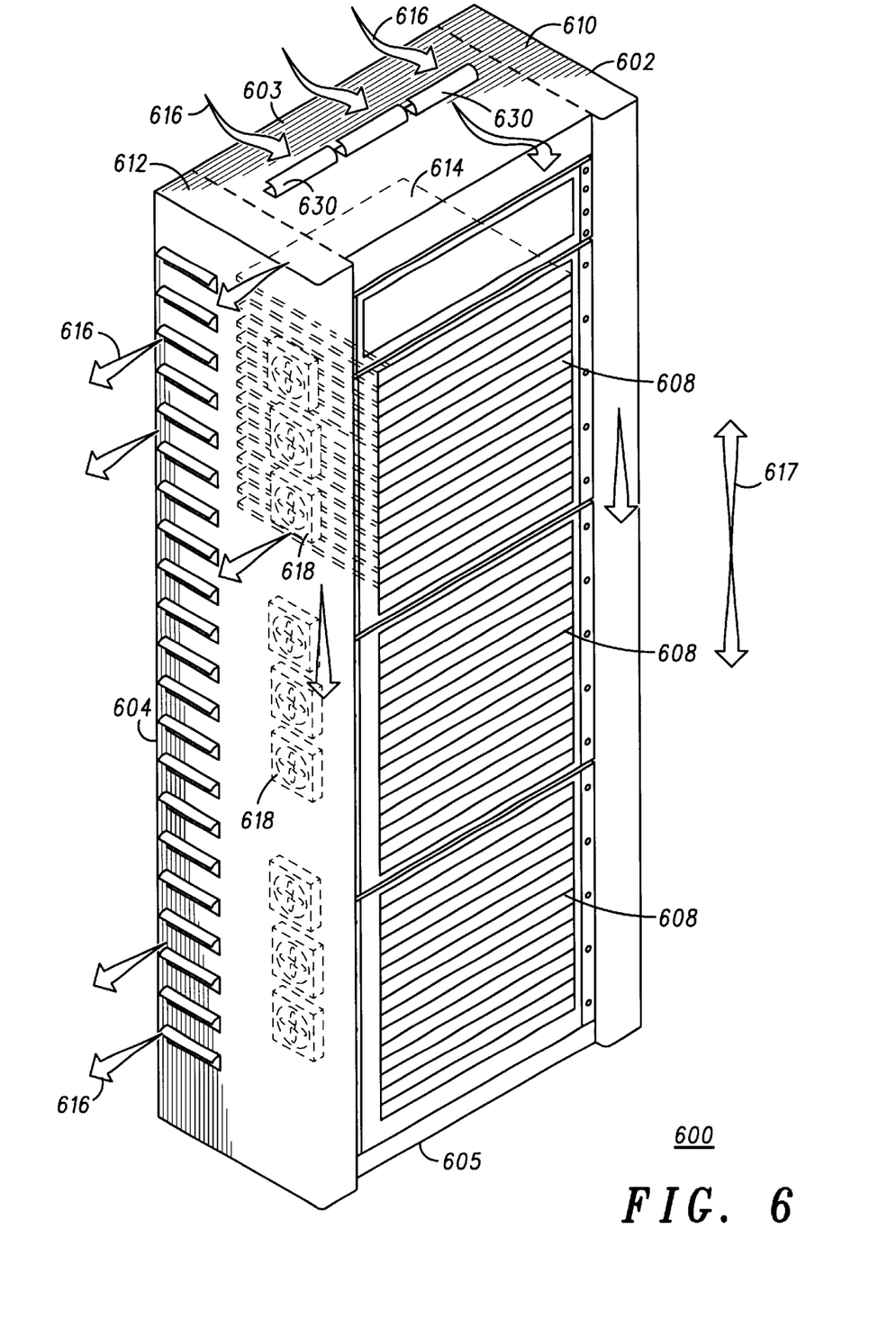
FIG. 6 is a front elevational view of a cabinet in accordance with still yet another embodiment of the invention.

FIG. 6 is a front elevational view of a cabinet 600 in accordance with still yet another embodiment of the invention. As shown in FIG. 6, top surface 603 defines a plurality of top inlet orifices 630 through which cooling air 616 enters cabinet 600 via first interspace region 610. Plurality of top inlet orifices 630 can be placed on top surface 603 in any location and pattern to facilitate the passing of cooling air 616. First side surface 602 and plurality of chassis 608 define first interspace region 610.

Cooling air 616 external to cabinet 617 is drawn into first interspace region 610 via plurality of top inlet orifices 630 and passes over plurality of electronic modules 614 in a substantially horizontal manner and substantially parallel to front surface 106 and rear surface (shown in FIG. 7). Cooling air 616 subsequently enters second interspace region 612 defined by second side surface 604 and plurality of chassis 608. Cooling air 616 is subsequently exhausted from cabinet 600, through, for example and without limitation, second side surface 604, top surface 603, and the like. First interspace region 610 and second interspace region 612 can act as air plenums for the introduction and exhaustion of cooling air 616 respectively, passing through cabinet 600. Cooling air 616 can be drawn into cabinet 600 and first interspace region 610, over plurality of electronic modules 614, into second interspace region 612 and exhausted from cabinet 600 using air moving apparatus 618. In an embodiment of the invention, cooling air 616 removes at least 8,000 W of thermal energy from cabinet 600. Plurality of top inlet orifices 630, and the number and operating point of air moving apparatus 618 can be chosen and sized to fit a particular application and is well within the abilities of one of ordinary skill in the art.

In the embodiments depicted in FIGS. 1–6, cooling air is depicted as entering or exiting the top surface or the bottom surface respectively. The invention is not limited to these configurations and can include other configurations whereby cooling air enters cabinet into first interspace region and passes through second interspace region before exiting cabinet. For example, cooling air can enter through the bottom surface and also exit through the bottom surface. Also, cooling air can enter through the top surface and exit through the top surface. These and other derivations to the embodiments depicted in the above Figures are within the scope of the invention.

FIG. 7 is a top plan view of a cabinet 700 in accordance with yet another embodiment of the invention. As shown in FIG. 7, cabinet 700 has a front surface 706 and rear surface 707. In an embodiment of the invention, front surface 706 has a first front peripheral portion 732, a second front peripheral portion 734 and a front central portion 733, each running the height of cabinet 700 (where height of cabinet is depicted in previous Figures). First front peripheral portion 732 can have a width defined substantially by the width of first interspace region 710 as projected on front surface 706. Second front peripheral potion 734 can have a width defined substantially by the width of second interspace region 712 as projected on front surface 706. Front central portion 733 comprises substantially the remaining portion of front surface 706 that does not include first front peripheral portion 732 and second front peripheral portion 734. Front central portion 733 can comprise substantially the projection of plurality of chassis 708 on front surface 706. Front central portion 733 defines a front outward projection space 744, which substantially comprises the space defined by projecting front central portion 733, along the height of cabinet 700, in a frontal direction perpendicular and away from cabinet 700.

In an embodiment of the invention, cooling air 716 enters cabinet 700 via one or more of the cabinet surfaces, including first side surface 702, second side surface 704, top surface, bottom surface, front surface 706 and rear surface 707 in a similar manner as described above (cooling air 716 is not shown entering cabinet 700 in FIG. 7 in any particular location for clarity). Cooling air 716 enters first interspace region 710 as defined by first side surface 702 and plurality of chassis 708, and passes over plurality of electronic modules in a substantially horizontal manner and substantially parallel to front surface 706 and rear surface 707. Cooling air 716 subsequently enters second interspace region 712 defined by second side surface 704 and plurality of chassis 708. At least one of the first front peripheral portion 732 and second front peripheral portion 734 define a plurality of front surface exhaust orifices 740 to enable cooling air 716 to exit cabinet 700 without substantially impinging on front outward projection space 744. This allows heated cooling air 716 exhausted from cabinet 700 to not impinge on a user 748 of front surface 706 of cabinet 700. Cooling air 716 can be channeled through plurality of front surface exhaust orifices 740 using ducts, vanes, and the like, designed to fit a particular application as is within the abilities of one of ordinary skill in the art.

As an example of an embodiment, cooling air 716 can enter cabinet through first interspace region 710, remove thermal energy from plurality of electronic modules, subsequently enter second interspace region 712 and exit cabinet 700 through plurality of front surface exhaust orifices 740 defined by second front peripheral portion 734. In another embodiment, cooling air 716 can enter cabinet through second interspace region 712, remove thermal energy from plurality of electronic modules, subsequently enter first interspace region 710 and exit cabinet 700 through plurality of front surface exhaust orifices 740 defined by first front peripheral portion 732.

In another embodiment of the invention, rear surface 707 has a first rear peripheral portion 736, a second rear peripheral portion 738 and a rear central portion 737, each running the height of cabinet 700 (where height of cabinet is depicted in previous Figures). First rear peripheral portion 736 can have a width defined substantially by the width of first interspace region 710 as projected on rear surface 707. Second rear peripheral potion 738 can have a width defined substantially by the width of second interspace region 712 as projected on rear surface 707. Rear central portion 737 comprises substantially the remaining portion of rear surface 707 that does not include first rear peripheral portion 736 and second rear peripheral portion 738. Rear central portion 737 can comprise substantially the projection of plurality of chassis 708 on rear surface 707. Rear central portion 737 defines a rear outward projection space 746, which substantially comprises the space defined by projecting rear central portion 737 along the height of cabinet 700 in a rearward direction perpendicular and away from cabinet 700.

In an embodiment of the invention, cooling air 716 enters cabinet 700 via one or more of the cabinet surfaces, including first side surface 702, second side surface 704, top surface, bottom surface, front surface 706 and rear surface 707 in a similar manner as described above. Cooling air 716 enters first interspace region 710 as defined by first side surface 702 and plurality of chassis 708, and passes over plurality of electronic modules in a substantially horizontal manner and substantially parallel to front surface 706 and rear surface 707. Cooling air 716 subsequently enters second interspace region 712 defined by second side surface 704 and plurality of chassis 708. At least one of the first rear peripheral portion 736 and second rear peripheral portion 738 define a plurality of rear surface exhaust orifices 742 to enable cooling air 716 to exit cabinet 700 without substantially impinging on rear outward projection space 746. This allows heated cooling air 716 exhausted from cabinet 700 to not impinge on user/cables (not shown for clarity) and the like located in rear outward projection space 746. Cooling air 716 can be channeled through plurality of rear surface exhaust orifices 742 using ducts, vanes, and the like, designed to fit a particular application as is within the abilities of one of ordinary skill in the art.

As an example of an embodiment, cooling air 716 can enter cabinet through first interspace region 710, remove thermal energy from plurality of electronic modules, subsequently enter second interspace region 712 and exit cabinet

700 through plurality of rear surface exhaust orifices 742 defined by second rear peripheral portion 738. In another embodiment, cooling air 716 can enter cabinet through second interspace region 712, remove thermal energy from plurality of electronic modules, subsequently enter first interspace region 710 and exit cabinet 700 through plurality of rear surface exhaust orifices 742 defined by first rear peripheral portion 736.

Cooling air can exit cabinet from any combination of one or more of first and second front peripheral portions and first and second rear peripheral portions and be within the scope of the invention. Also, cooling air can exit cabinet through any combination of one or more of the plurality of cabinet surfaces as described above and be within the scope of the invention.

Figure 8:
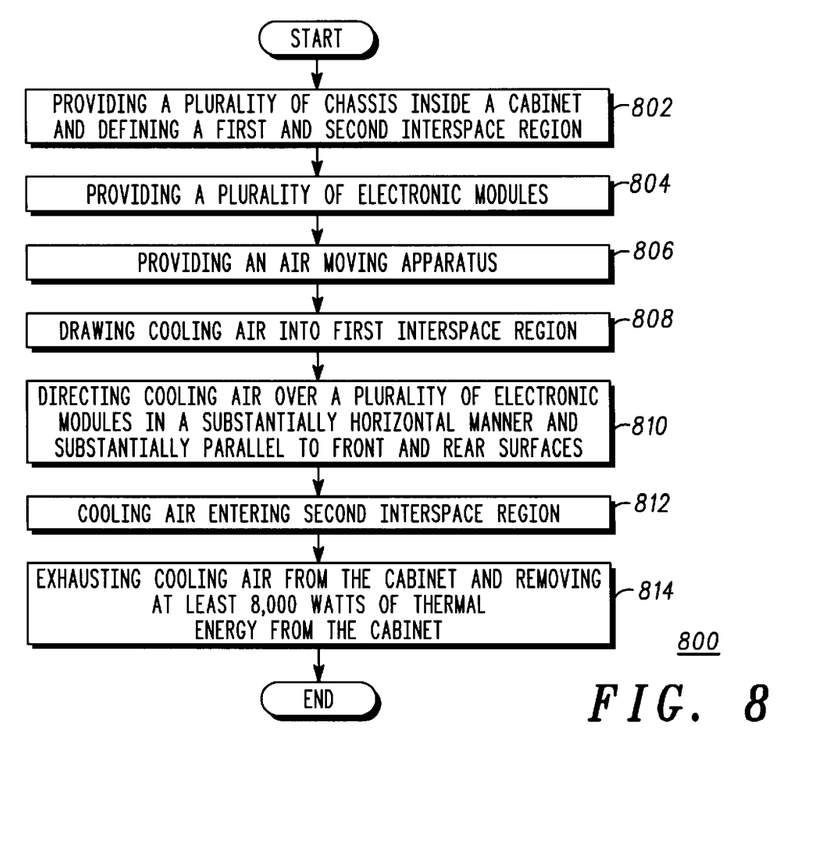
FIG. 8 is a flow chart in accordance with an embodiment of the invention.

FIG. 8 is a flow chart 800 in accordance with an embodiment of the invention. Step 802 includes providing a plurality of chassis inside a cabinet, where the cabinet includes a first side surface, a second side surface, a front surface and a rear surface. Plurality of chassis and the first side surface define first interspace region. Plurality of chassis and second side surface define second interspace region.

Step 804 includes providing a plurality of electronic modules coupled to each of the plurality of chassis, where the plurality of electronic modules are horizontally disposed within each of the chassis, and where at least a portion of the plurality of modules produce more than 150 W of thermal energy each.

Step 806 includes providing an air moving apparatus coupled to draw cooling air into the cabinet. In step 808, air moving apparatus draws cooling air into first interspace region. In step 810, cooling air is directed over the plurality of electronic modules in a substantially horizontal manner and substantially parallel to front surface and rear surface.

Subsequently in step 812, cooling air enters second interspace region. In step 814, cooling air is exhausted from the cabinet removing at least 8,000 W of thermal energy from the cabinet.

While we have shown and described specific embodiments of the present invention, further modifications and improvements will occur to those skilled in the art. It is therefore, to be understood that appended claims are intended to cover all such modifications and changes as fall within the true spirit and scope of the invention.

What is claimed is:

1. A cabinet for cooling electronic modules, comprising:
   a plurality of outer surfaces comprising a first side surface, a second side surface, a front surface and a rear surface, wherein the first side surface defines a plurality of side inlet orifices to enable cooling air to enter the cabinet, and wherein the second side surface defines a plurality of side exhaust orifices to enable the cooling air to exit the cabinet;
   a plurality of chassis encompassed by the plurality of outer surfaces, wherein the plurality of chassis and the first side surface define a first interspace region, and wherein the plurality of chassis and the second side surface define a second interspace region;
   a plurality of electronic modules coupled to each of the plurality of chassis, wherein the plurality of electronic modules are substantially horizontally disposed within each of the plurality of chassis, and wherein at least a portion of the plurality of electronic modules produce more than 150 Watts of thermal energy each; and
   an air moving apparatus coupled to draw the cooling air external to the cabinet into the first interspace region, wherein the cooling air passes over the plurality of electronic modules in a substantially horizontal manner and substantially parallel to the front surface and the rear surface, wherein the cooling air subsequently enters the second interspace region and is thereafter exhausted from the cabinet, and wherein the cooling air removes at least 8,000 Watts of thermal energy from the cabinet.

2. A cabinet for cooling electronic modules, comprising:
   a plurality of outer surfaces comprising a first side surface, a second side surface, a front surface, a rear surface and a top surface substantially perpendicular to the first side surface, wherein the first side surface defines a plurality of side inlet orifices to enable cooling air to enter the cabinet, and wherein the top surface defines a plurality of top exhaust orifices to enable the cooling air to exit the cabinet;
   a plurality of chassis encompassed by the plurality of outer surfaces, wherein the plurality of chassis and the first side surface define a first interspace region, and wherein the plurality of chassis and the second side surface define a second interspace region;
   a plurality of electronic modules coupled to each of the plurality of chassis, wherein the plurality of electronic modules are substantially horizontally disposed within each of the plurality of chassis, and wherein at least a portion of the plurality of electronic modules produce more than 150 Watts of thermal energy each; and
   an air moving apparatus coupled to draw the cooling air external to the cabinet into the first interspace region, wherein the cooling air passes over the plurality of electronic modules in a substantially horizontal manner and substantially parallel to the front surface and the rear surface, wherein the cooling air subsequently enters the second interspace region and is thereafter exhausted from the cabinet, and wherein the cooling air removes at least 8,000 Watts of thermal energy from the cabinet.

3. A cabinet for cooling electronic modules, comprising:
   a plurality of outer surfaces comprising a first side surface, a second side surface, a front surface, a rear surface and a bottom surface substantially perpendicular to the first side surface, wherein the first side surface defines a plurality of side inlet orifices to enable cooling air to enter the cabinet, and wherein the bottom surface defines a plurality of bottom exhaust orifices to enable the cooling air to exit the cabinet;
   a plurality of chassis encompassed by the plurality of outer surfaces, wherein the plurality of chassis and the first side surface define a first interspace region, and wherein the plurality of chassis and the second side surface define a second interspace region;
   a plurality of electronic modules coupled to each of the plurality of chassis, wherein the plurality of electronic modules are substantially horizontally disposed within each of the plurality of chassis, and wherein at least a portion of the plurality of electronic modules produce more than 150 Watts of thermal energy each; and
   an air moving apparatus coupled to draw the cooling air external to the cabinet into the first interspace region, wherein the cooling air passes over the plurality of electronic modules in a substantially horizontal manner and substantially parallel to the front surface and the rear surface, wherein the cooling air subsequently enters the second interspace region and is thereafter exhausted from the cabinet, and wherein the cooling air removes at least 8,000 Watts of thermal energy from the cabinet.

4. A cabinet for cooling electronic modules, comprising:
- a plurality of outer surfaces comprising a first side surface, a second side surface, a front surface and a rear surface, wherein the front surface has a first front peripheral portion, a second front peripheral portion and a front central portion, wherein at least one of the first front peripheral portion and the second front peripheral portion define a plurality of front surface exhaust orifices to enable cooling air to exit the cabinet without substantially impinging on a front outward projection space of the front central portion;
- a plurality of chassis encompassed by the plurality of outer surfaces, wherein the plurality of chassis and the first side surface define a first interspace region, and wherein the plurality of chassis and the second side surface define a second interspace region;
- a plurality of electronic modules coupled to each of the plurality of chassis, wherein the plurality of electronic modules are substantially horizontally disposed within each of the plurality of chassis, and wherein at least a portion of the plurality of electronic modules produce more than 150 Watts of thermal energy each; and
- an air moving apparatus coupled to draw the cooling air external to the cabinet into the first interspace region, wherein the cooling air passes over the plurality of electronic modules in a substantially horizontal manner and substantially parallel to the front surface and the rear surface, wherein the cooling air subsequently enters the second interspace region and is thereafter exhausted from the cabinet, and wherein the cooling air removes at least 8,000 Watts of thermal energy from the cabinet.

5. A cabinet for cooling electronic modules, comprising:
- a plurality of outer surfaces comprising a first side surface, a second side surface, a front surface and a rear surface, wherein the rear surface has a first rear peripheral portion, a second rear peripheral portion and a rear central portion, wherein at least one of the first rear peripheral portion and the second rear peripheral portion define a plurality of rear surface exhaust orifices to enable cooling air to exit the cabinet without substantially impinging on an rear outward projection space of the rear central portion;
- a plurality of chassis encompassed by the plurality of outer surfaces, wherein the plurality of chassis and the first side surface define a first interspace region, and wherein the plurality of chassis and the second side surface define a second interspace region;
- a plurality of electronic modules coupled to each of the plurality of chassis, wherein the plurality of electronic modules are substantially horizontally disposed within each of the plurality of chassis, and wherein at least a portion of the plurality of electronic modules produce more than 150 Watts of thermal energy each; and
- an air moving apparatus coupled to draw the cooling air external to the cabinet into the first interspace region, wherein the cooling air passes over the plurality of electronic modules in a substantially horizontal manner and substantially parallel to the front surface and the rear surface, wherein the cooling air subsequently enters the second interspace region and is thereafter exhausted from the cabinet, and wherein the cooling air removes at least 8,000 Watts of thermal energy from the cabinet.

6. A method of cooling electronic modules in a cabinet, comprising:
- the cabinet including a first side surface, a second side surface, a front surface and a rear surface;
- providing a plurality of chassis inside of the cabinet, wherein the plurality of chassis and the first side surface define a first interspace region, and wherein the plurality of chassis and the second side surface define a second interspace region;
- providing a plurality of electronic modules coupled to each of the plurality of chassis, wherein the plurality of electronic modules are substantially horizontally disposed within each of the plurality of chassis, and wherein at least a portion of the plurality of electronic modules produce more than 150 Watts of thermal energy each;
- providing an air moving apparatus coupled draw cooling air into the cabinet;
- the air moving apparatus drawing the cooling air external to the cabinet into the first interspace region;
- the cooling air entering the cabinet through a plurality of side inlet orifices defined by the first side and the cooling air exiting the cabinet through a plurality of exhaust orifices defined by the second side surface;
- directing the cooling air over the plurality of electronic modules in a substantially horizontal manner and substantially parallel to the front surface and the rear surface;
- the cooling air subsequently entering the second interspace region; and
- exhausting the cooling air from the cabinet, wherein the cooling air removes at least 8,000 Watts of thermal energy from the cabinet.

7. A method of cooling electronic modules in a cabinet, comprising:
- the cabinet including a first side surface, a second side surface, a front surface, a rear surface and a top surface substantially perpendicular to the first side surface;
- providing a plurality of chassis inside of the cabinet, wherein the plurality of chassis and the first side surface define a first interspace region, and wherein the plurality of chassis and the second side surface define a second interspace region;
- providing a plurality of electronic modules coupled to each of the plurality of chassis, wherein the plurality of electronic modules are substantially horizontally disposed within each of the plurality of chassis, and wherein at least a portion of the plurality of electronic modules produce more than 150 Watts of thermal energy each;
- providing an air moving apparatus coupled draw cooling air into the cabinet;
- the air moving apparatus drawing the cooling air external to the cabinet into the first interspace region;
- the cooling air entering the cabinet through a plurality of side inlet orifices defined by the first side surface and exiting the cabinet through a plurality of top exhaust orifices defined by the top surface;
- directing the cooling air over the plurality of electronic modules in a substantially horizontal manner and substantially parallel to the front surface and the rear surface;
- the cooling air subsequently entering the second interspace region; and
- exhausting the cooling air from the cabinet, wherein the cooling air removes at least 8,000 Watts of thermal energy from the cabinet.

8. A method of cooling electronic modules in a cabinet, comprising:

the cabinet including a first side surface, a second side surface, a front surface, a rear surface and a bottom surface substantially perpendicular to the first side surface;

providing a plurality of chassis inside of the cabinet, wherein the plurality of chassis and the first side surface define a first interspace region, and wherein the plurality of chassis and the second side surface define a second interspace region;

providing a plurality of electronic modules coupled to each of the plurality of chassis, wherein the plurality of electronic modules are substantially horizontally disposed within each of the plurality of chassis, and wherein at least a portion of the plurality of electronic modules produce more than 150 Watts of thermal energy each;

providing an air moving apparatus coupled draw cooling air into the cabinet;

the air moving apparatus drawing the cooling air external to the cabinet into the first interspace region;

the cooling air entering the cabinet through a plurality of side inlet orifices defined by the first side surface and exiting the cabinet through a plurality of bottom exhaust orifices defined by the bottom surface;

directing the cooling air over the plurality of electronic modules in a substantially horizontal manner and substantially parallel to the front surface and the rear surface;

the cooling air subsequently entering the second interspace region; and exhausting the cooling air from the cabinet, wherein the cooling air removes at least 8,000 Watts of thermal energy from the cabinet.

9. A method of cooling electronic modules in a cabinet, comprising:

the cabinet including a first side surface, a second side surface, a front surface and a rear surface, wherein the front surface-has a first front peripheral portion, a second front peripheral portion and a front central portion, wherein at least one of the first front peripheral portion and the second front peripheral portion define a plurality of front surface exhaust orifices;

providing a plurality of chassis inside of the cabinet, wherein the plurality of chassis and the first side surface define a first interspace region, and wherein the plurality of chassis and the second side surface define a second interspace region;

providing a plurality of electronic modules coupled to each of the plurality of chassis, wherein the plurality of electronic modules are substantially horizontally disposed within each of the plurality of chassis, and wherein at least a portion of the plurality of electronic modules produce more than 150 Watts of thermal energy each;

providing an air moving apparatus coupled draw cooling air into the cabinet;

the air moving apparatus drawing the cooling air external to the cabinet into the first interspace region;

directing the cooling air over the plurality of electronic modules in a substantially horizontal manner and substantially parallel to the front surface and the rear surface;

the cooling air subsequently entering the second interspace region;

exhausting the cooling air from the cabinet, wherein the cooling air removes at least 8,000 Watts of thermal energy from the cabinet; and the cooling air exiting the cabinet through the plurality of front surface exhaust orifices without substantially impinging on a front outward projection space of the front central portion.

10. A method of cooling electronic modules in a cabinet, comprising:

the cabinet including a first side surface, a second side surface, a front surface and a rear surface, wherein the rear surface has a first rear peripheral portion, a rear second peripheral portion and a rear central portion, wherein at least one of the first rear peripheral portion and the second rear peripheral portion define a plurality of rear surface exhaust orifices;

providing a plurality of chassis inside of the cabinet, wherein the plurality of chassis and the first side surface define a first interspace region, and wherein the plurality of-chassis and the second side surface define a second interspace region;

providing a plurality of electronic modules coupled to each of the plurality of chassis, wherein the plurality of electronic modules are substantially horizontally disposed within each of the plurality of chassis, and wherein at least a portion of the plurality of electronic modules produce more than 150 Watts of thermal energy each;

providing an air moving apparatus coupled draw cooling air into the cabinet;

the air moving apparatus drawing the cooling air external to the cabinet into the first interspace region;

directing the cooling air over the plurality of electronic modules in a substantially horizontal manner and substantially parallel to the front surface and the rear surface;

the cooling air subsequently entering the second interspace region;

exhausting the cooling air from the cabinet, wherein the cooling air removes at least 8,000 Watts of thermal energy from the cabinet; and the cooling air exiting the cabinet through the plurality of rear surface exhaust orifices without substantially impinging on a rear outward projection space of the rear central portion.

* * * * *